(12) United States Patent
Lee et al.

(10) Patent No.: US 8,013,651 B2
(45) Date of Patent: Sep. 6, 2011

(54) SIGNAL CONVERTER FOR WIRELESS COMMUNICATION AND RECEIVING DEVICE USING THE SAME

(75) Inventors: Seung Sik Lee, Daejeon (KR); Bong Hyuk Park, Daejeon (KR); Seunghyun Jang, Daejeon (KR); Sangsung Choi, Daejeon (KR); Changwan Kim, Busan (KR)

(73) Assignee: Electronics & Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/580,360

(22) Filed: Oct. 16, 2009

(65) Prior Publication Data

US 2010/0148849 A1    Jun. 17, 2010

(30) Foreign Application Priority Data

Dec. 16, 2008    (KR) .......................... 10-2008-0128052

(51) Int. Cl.
*H03H 11/16* (2006.01)
(52) U.S. Cl. ........................................ 327/231; 455/326
(58) Field of Classification Search .................. None
See application file for complete search history.

(56) References Cited

U.S. PATENT DOCUMENTS

| | | | | |
|---|---|---|---|---|
| 6,057,714 A | * | 5/2000 | Andrys et al. | 327/105 |
| 7,215,201 B2 | * | 5/2007 | Roine | 330/269 |
| 7,646,250 B2 | * | 1/2010 | Mun et al. | 330/301 |
| 2003/0114129 A1 | * | 6/2003 | Jerng | 455/323 |
| 2006/0128340 A1 | * | 6/2006 | Hsieh et al. | 455/302 |

FOREIGN PATENT DOCUMENTS

| KR | 10-2007-0106009 A | 10/2007 |
|---|---|---|
| WO | 2006/077552 A1 | 7/2006 |

OTHER PUBLICATIONS

M. Kumarasamy Raja, et al., "A Fully Integrated Variable Gain 5.75-GHz LNA with on chip Active Balun for WLAN", RF1C Symposium, 2003 Proceeding, pp. 439-442, Jun. 2003.

Ranjit Gharpurey, "A Broadband Low-Noise Front-End Amplifier for Ultra Wideband in 0.13-μm CMOS", IEEE Journal of Solid-State Circuits (JSSC), vol. 40, No. 9, pp. 1983-1956, Sep. 2005.

* cited by examiner

*Primary Examiner* — Cassandra Cox
(74) *Attorney, Agent, or Firm* — Kile Park Goekjian Reed & McManus PLLC

(57) ABSTRACT

The present invention relates to a signal converting device and receiving device in a wireless communication system. The receiving device of the wireless communication system includes a differential signal converter for receiving a single ended radio frequency signal and converting it into a differential radio frequency signal, and a frequency down converter for down converting the differential radio frequency signal to down frequency signal.

15 Claims, 6 Drawing Sheets

SIGNAL CONVERTER FOR WIRELESS COMMUNICATION AND RECEIVING DEVICE USING THE SAME

CROSS-REFERENCE TO RELATED APPLICATION

This application claims priority to and the benefit of Korean Patent Application No. 10-2008-0128052 filed in the Korean Intellectual Property Office on Dec. 16, 2008, the entire contents of which are incorporated herein by reference.

BACKGROUND OF THE INVENTION (a) Field of the Invention

The present invention relates to a signal converting device in a wireless communication system and a receiving device using the same.

(b) Description of the Related Art

A receiving device of a wireless communication system receives radio frequency signals from a transmitting device through an antenna to filter them, amplify them, frequency-convert them, and convert them into analog to digital signals. In this instance, frequency conversion represents a process for converting the radio frequency signal into a baseband frequency or an intermediate frequency (IF) by using a frequency down converter.

The frequency down converter combines an input signal and a local oscillator's signal to generate a baseband frequency signal corresponding to the frequency difference between the two signals. However, when the local oscillator's signal appears as a leakage signal to the frequency down converter's output, it can worsen the entire linearity of the receiving device of the wireless communication system. Therefore, a double balance frequency converter is generally used for the frequency down converter in order to minimize leakage of the local oscillation signal. The double balance frequency converter has a circuit structure of using differential signals.

However, in the receiving device of the wireless communication system, the antenna for directly receiving the radio frequency signals is generally designed to process single ended signals because of size and cost. Hence, the radio frequency signal is required to be converted from the single ended signal to the differential signal before it is input to the frequency down converter.

For this purpose, various differential signal converting devices are additionally inserted into the receiving device of the wireless communication system. However, the addition of such differential signal converting devices increases current consumption of the receiving device, degrades noise figure and linear characteristic at a receiving terminal, and increases size and cost of the receiving device.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a receiving device of a wireless communication system for converting a single ended radio frequency signal into a differential signal with low noise and low power consumption.

An exemplary embodiment of the present invention provides a receiving device of a wireless communication system including: a differential signal converter for receiving a single ended radio frequency signal and converting the same into a differential radio frequency signal; and a frequency down converter for down converting the differential radio frequency signal to down frequency signal.

The differential signal converter includes a common gate amplifier and a common source amplifier using the same bias current source.

The common gate amplifier and the common source amplifier are coupled in series between a drive voltage and the bias current source.

The differential signal converter includes an input terminal for receiving the single ended radio frequency signal, and the common gate amplifier and the common source amplifier receive the single ended radio frequency signal through the input terminal.

The common gate amplifier generates a positive signal of the differential radio frequency signal from the single ended radio frequency signal, and includes a first output terminal for outputting the positive signal of the differential radio frequency signal, and the common source amplifier generates a negative signal of the differential radio frequency signal from the single ended radio frequency signal, and includes a second output terminal for outputting the negative signal of the differential radio frequency signal.

The common gate amplifier further includes a first transistor and a first load coupled in series, a node thereof being coupled to the first output terminal, and the common source amplifier further includes a second transistor and a second load coupled in series, a node thereof being coupled to the second output terminal.

The product of transconductance of the first transistor and the first load corresponds to the product of transconductance of the second transistor and the second load.

The first transistor is an n-channel field effect transistor, and the second transistor is a p-channel field effect transistor.

The first load corresponds to the product of the second load, resistance formed between a receiving terminal for receiving the single ended radio frequency signal and the input terminal, and transconductance of the second transistor.

The first load includes a first resistor and a first inductor coupled in parallel, and the second load includes a second resistor and a second inductor coupled in parallel.

The frequency down converter includes a third transistor, a fourth transistor, a fifth transistor, and a sixth transistor, and the first output terminal is coupled to source terminals of the third and fourth transistors, and the second output terminal is coupled to source terminals of the fifth and sixth transistors.

The first load and the second load meet on a node, and the node is AC grounded.

Another embodiment of the present invention provides a differential signal converting device including: a common gate amplifier for receiving a single ended radio frequency signal and outputting a first radio frequency signal; and a common source amplifier for receiving the single ended radio frequency signal and outputting a second radio frequency signal, wherein the common gate amplifier and the common source amplifier use the same bias current source.

The common gate amplifier includes a first transistor including a gate terminal for receiving a first voltage, a source terminal for receiving the single ended radio frequency signal, and drain terminal for outputting the first radio frequency signal; and a first load coupled to the drain terminal of the first transistor, and the source gate amplifier includes a second transistor including a gate terminal for receiving the single ended radio frequency signal, a source terminal for receiving a second voltage, and a drain terminal for outputting the second radio frequency signal; and a second load coupled to the drain terminal of the first transistor.

The product of transconductance of the first transistor and the first load corresponds to the product of transconductance of the second transistor and the second load.

The first load corresponds to the product of the second load, resistance formed between a receiving terminal for receiving the single ended radio frequency signal and the input terminal, and transconductance of the second transistor.

The first load and the second load are AC grounded.

According to an embodiment of the present invention, power consumption is reduced noise figure is improved when the single ended radio frequency signal received by the receiving device of the wireless communication system is converted into the differential signal. Further, the size of the receiving device of the wireless communication system is reduced.

DETAILED DESCRIPTION OF THE EMBODIMENTS

Figure 1:
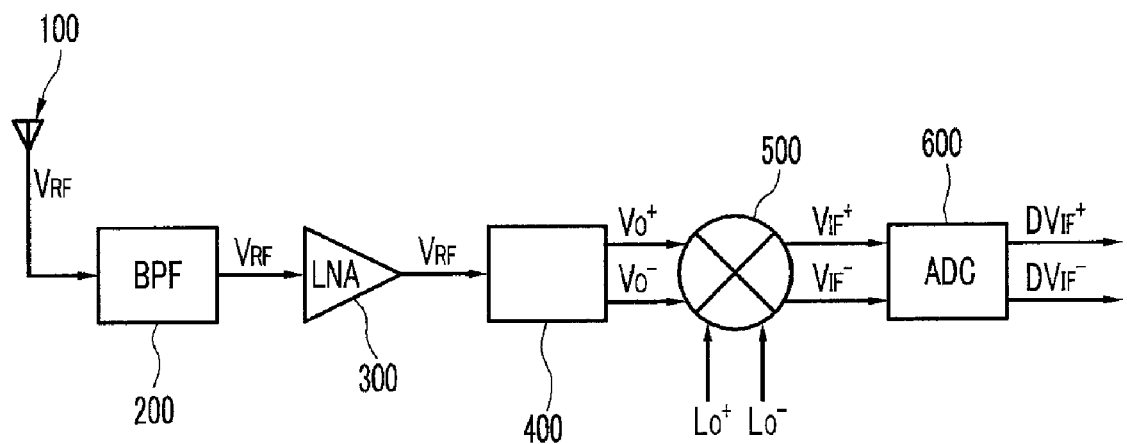
FIG. 1 shows a block diagram of a receiving device of a wireless communication system according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element.

Throughout the specification, unless explicitly described to the contrary, the word "comprise" and variations such as "comprises" or "comprising", will be understood to imply the inclusion of stated elements but not the exclusion of any other elements.

A receiving device of a wireless communication system according to an exemplary embodiment of the present invention will now be described in detail with reference to FIG. 1.

FIG. 1 shows a block diagram of a receiving device of a wireless communication system according to an exemplary embodiment of the present invention.

Referring to FIG. 1, the receiving device of the wireless communication system includes an antenna 100 coupled in series, a band pass filter (BPF) 200, a low noise amplifier (LNA) 300, a differential signal converter 400, a frequency down converter 500 and an analog to digital converter (ADC) 600.

The antenna 100 receives a radio frequency signal ($V_{RF}$) from a transmitting device of the wireless communication system.

The band pass filter 200 selects a frequency signal of a predetermined bandwidth from the signal received by the antenna 100, and controls it to be passed.

The low noise amplifier 300 amplifies the signal selected by the band pass filter 200 while minimizing noise.

The differential signal converter 400 converts the signal amplified by the low noise amplifier 300 from the single ended signal ($V_{RF}$) to the differential signals ($V_O^+, V_O^-$).

The frequency down converter 500 converts the differential radio frequency signals ($V_O^+, V_O^-$) into a baseband frequency or intermediate frequency signals ($V_{IF}^+, V_{IF}^-$).

The analog to digital converter (ADC) 600 receives the baseband frequency signal or the intermediate frequency signals ($V_{IF}^+, V_{IF}^-$) from the frequency down converter 500 and converts the same into digital values ($DV_{IF}^+, DV_{IF}^-$).

A differential signal converter of the wireless communication system according to an exemplary embodiment of the present invention will now be described with reference to FIG. 2.

Figure 2:
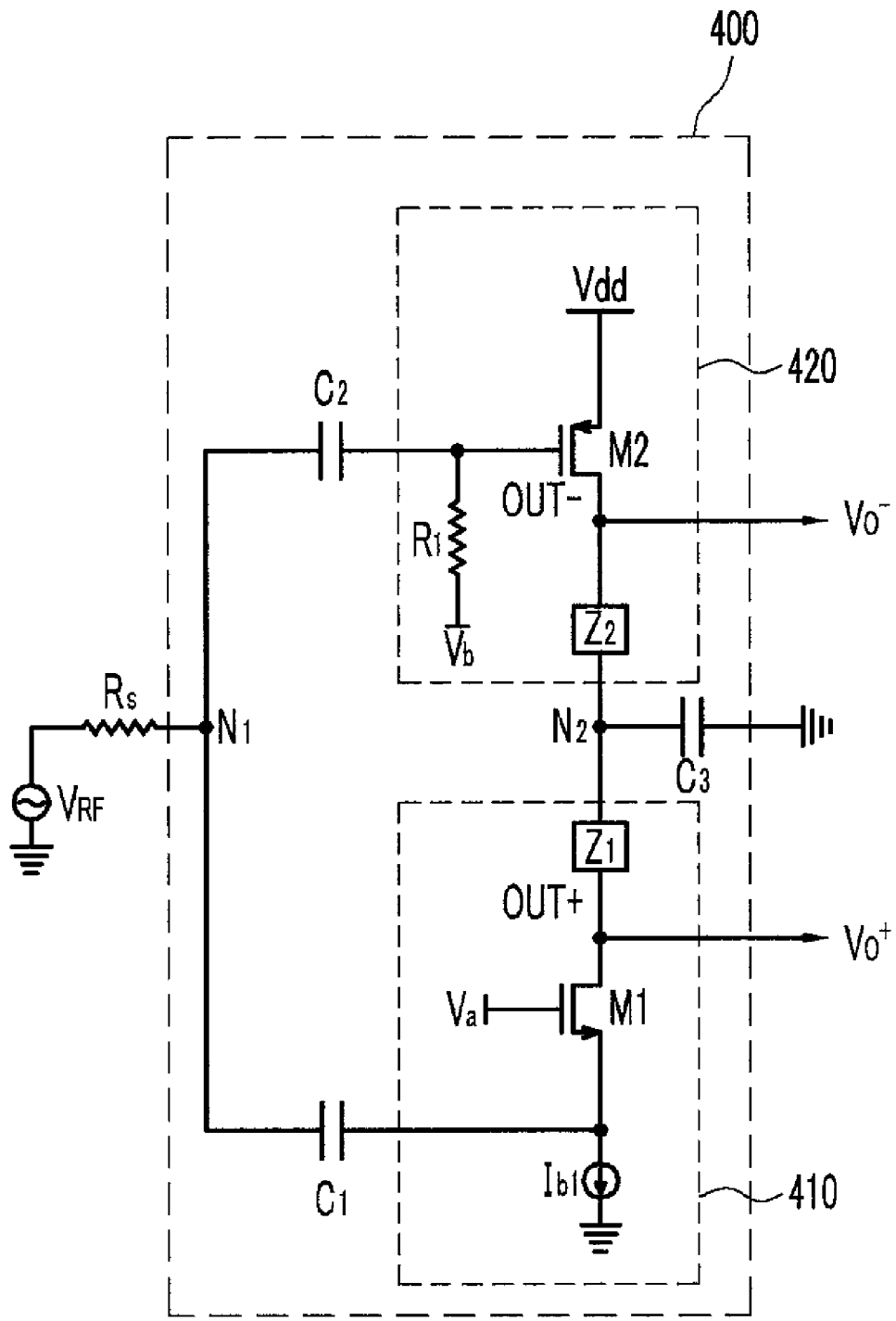
FIG. 2 shows an equivalent circuit diagram of a differential signal converter of a wireless communication system according to an exemplary embodiment of the present invention.

FIG. 2 shows an equivalent circuit diagram of a differential signal converter of a wireless communication system according to an exemplary embodiment of the present invention.

Referring to FIG. 2, the differential signal converter 400 of the wireless communication system includes a common gate amplifier 410, a common source amplifier 420, first, second, and third capacitors C1, C2, and C3, an input terminal N1, and differential output terminals (OUT$^+$, OUT$^-$).

The common gate amplifier 410 and the common source amplifier 420 are coupled in common to an input terminal (N1) through the first and second capacitors C1 and C2 respectively. Also, the common gate amplifier 410 and the common source amplifier 420 are coupled in common to the second node N2. A voltage source modeled by the single ended radio frequency signal ($V_{RF}$) is coupled to the first node N1, and Rs indicates a resistor between a receiving terminal of the single ended radio frequency signal ($V_{RF}$) and the input terminal N1. The second node N2 is AC grounded through the third capacitor C3.

The common gate amplifier 410 includes a first transistor M1 and a first load Z1. The first transistor M1 represents an n-channel field effect transistor (FET). A gate terminal of the first transistor M1 is coupled to the first voltage (Va), a drain terminal thereof is coupled a positive output terminal (OUT$^+$) of the differential output terminal, and a source terminal thereof is coupled to a first bias current source Ib1. The first load Z1 is coupled between the drain terminal of the first transistor M1 and a node N2. A positive output voltage ($V_o^+$) from among the differential output signals is output to the drain terminal of the first transistor M1 that is the positive output terminal (OUT$^+$).

The common source amplifier 420 includes a second transistor M2 and a second load Z2. The second transistor M2 is a p-channel field effect transistor. A gate terminal of the second transistor M2 is coupled to a second voltage (Vb) through the first resistor R1, a drain terminal thereof is coupled to a second load Z2, and a source terminal thereof is coupled to a drive voltage (Vdd). A negative output voltage ($V_o^-$) from among the differential output voltages is output to the drain terminal of the second transistor M2.

The single ended radio frequency signal ($V_{RF}$) is simultaneously applied to the common gate amplifier 410 and the common source amplifier 420 through the node N1 and it is then output with a subsequent voltage gain.

$$V_o^+ = +g_{mN} Z_1 V_{RF} \quad \text{[Equation 1]}$$

$$V_o^- = -g_{mP} Z_2 V_{RF} \quad \text{[Equation 2]}$$

Here, $g_{mN}$ and $g_{mP}$ are transconductance of the first transistor M1 and the second transistor M2 respectively.

In this instance, when voltage gain values of the common gate amplifier 410 and the common source amplifier 420 are controlled to be the same with each other, that is, $|g_{mN} Z_1| = |g_{mP} Z_2|$ and the polarities of the positive output voltage ($V_o^+$) and the negative output voltage ($V_o^-$) are controlled to be different, a perfect differential radio frequency signal is generated.

Here, since the first transistor M1 of the common gate amplifier 410 and the second transistor M2 of the common source amplifier 420 are coupled in series and there is one coupled current path, the same bias current flows thereto from the first bias current source Ib1. Therefore, power consumption is less than the case in which there are at least two paths of current flowing to the common gate amplifier 410 and the common source amplifier 420.

A noise characteristic of a differential signal converter according to an exemplary embodiment of the present invention will now be described with reference to FIG. 3.

Figure 3:
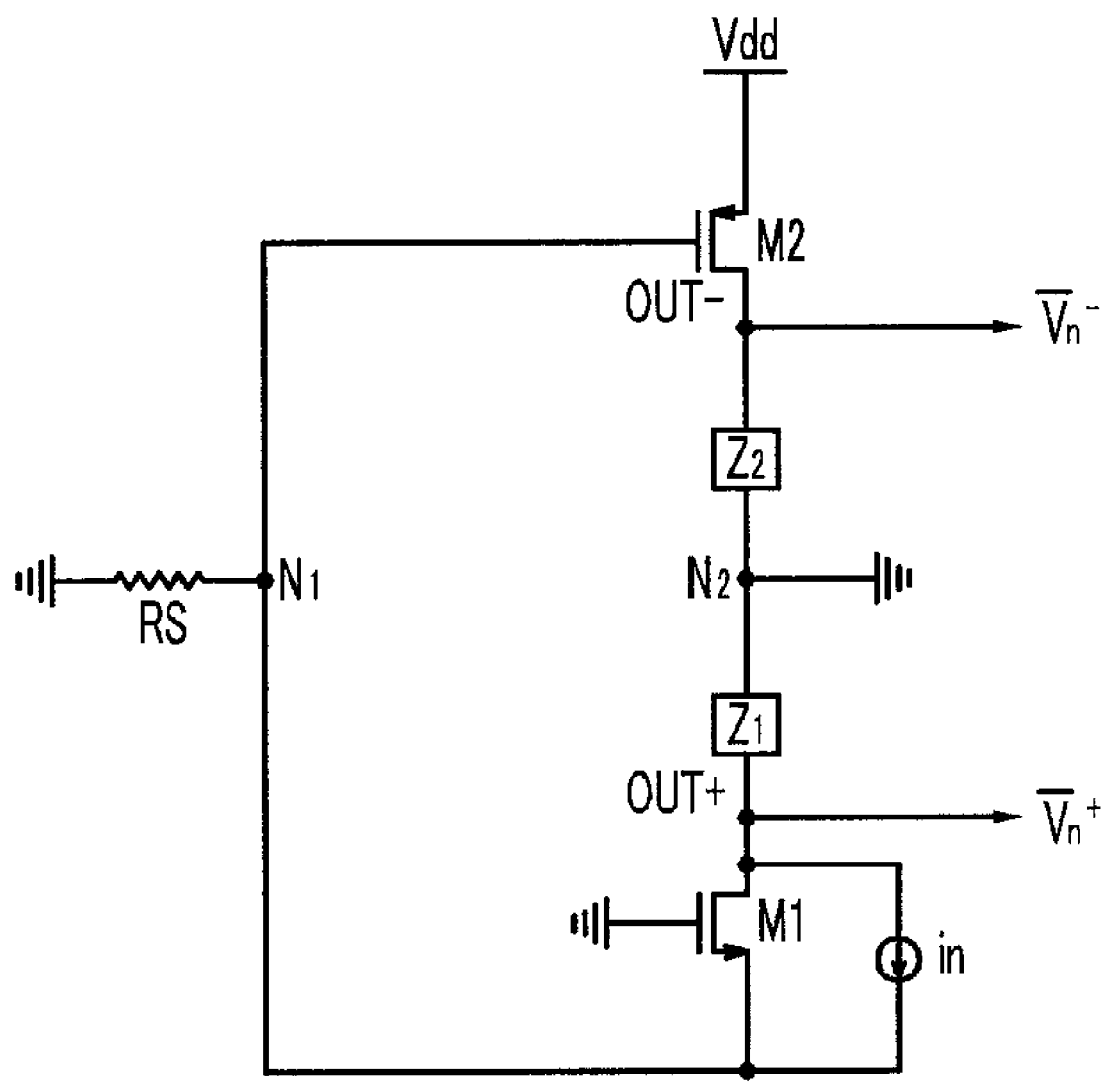
FIG. 3 shows an equivalent circuit diagram for a noise characteristic of a differential signal converter shown in FIG. 2.

FIG. 3 shows an equivalent circuit diagram for a noise characteristic of a differential signal converter shown in FIG. 2.

Referring to FIG. 3, the influence following channel thermal noise of the first transistor M1 can be expressed as a current source ($i_n$) coupled in parallel to the first transistor M1. The noise current ($i_s$) flowing to the first load Z1 and the resistor (Rs) according to the channel thermal noise current source ($i_n$) is expressed in Equation 3.

$$i_s = \frac{i_n}{1 + g_{mN} R_s} \quad \text{[Equation 3]}$$

Therefore, the output noise voltage ($Vn^+$) of the common gate amplifier 410 and the noise voltage (Vr) of the resistor (Rs) are expressed below respectively.

$$Vn^+ = -\frac{i_n}{1 + g_{mN} R_s} Z_1 \quad \text{[Equation 4]}$$

$$Vr = \frac{i_n}{1 + g_{mN} R_s} R_s \quad \text{[Equation 5]}$$

The noise voltage (Vr) of the resistor (Rs) is amplified by the common source amplifier 420 by the voltage gain ($-g_{mP} Z_2$) to be expressed as an output noise voltage ($Vn^-$) of the common source amplifier 420.

$$Vn^- = -\frac{i_n}{1 + g_{mN} R_s} g_{mP} R_s Z_2 \quad \text{[Equation 6]}$$

As expressed in Equation 4 and Equation 6, the channel thermal noise current source ($i_n$) of the first transistor M1 of the common gate amplifier 410 is output at the differential output terminals (OUT$^+$, OUT$^-$) as the same phase signal.

The channel thermal noise current source ($i_n$) of the first transistor M1 of the common gate amplifier 410 substantially influences the entire noise characteristic of the differential signal converter 400. Since entire noise of the differential signal converter 400 is given as the difference between the output noise voltage ($Vn^+$) of the common gate amplifier 410 and the output noise voltage ($Vn^-$) of the common source amplifier 420, the channel thermal noise current source ($i_n$) can be eliminated when the output noise voltage ($Vn^+$) of the common gate amplifier 410 corresponds to the output noise voltage ($Vn^-$) of the common source amplifier 420 as shown in Equation 7.

$$\begin{aligned} Vn^+ &= Vn^- \\ &= -\frac{i_n}{1 + g_{mN} R_s} Z_1 \\ &= -\frac{i_n}{1 + g_{mN} R_s} g_{mP} R_s Z_2 \end{aligned} \quad \text{[Equation 7]}$$

Equation 8 is derived from Equation 7.

$$Z_1 = g_{mP} R_s Z_2 \quad \text{[Equation 8]}$$

Therefore, when Equation 8 is satisfied, the channel thermal noise current source ($i_n$) of the common gate amplifier 410 is removed.

A differential signal converter and a frequency down converter of a wireless communication system according to an exemplary embodiment of the present invention will now be described with reference to FIG. 4.

Figure 4:
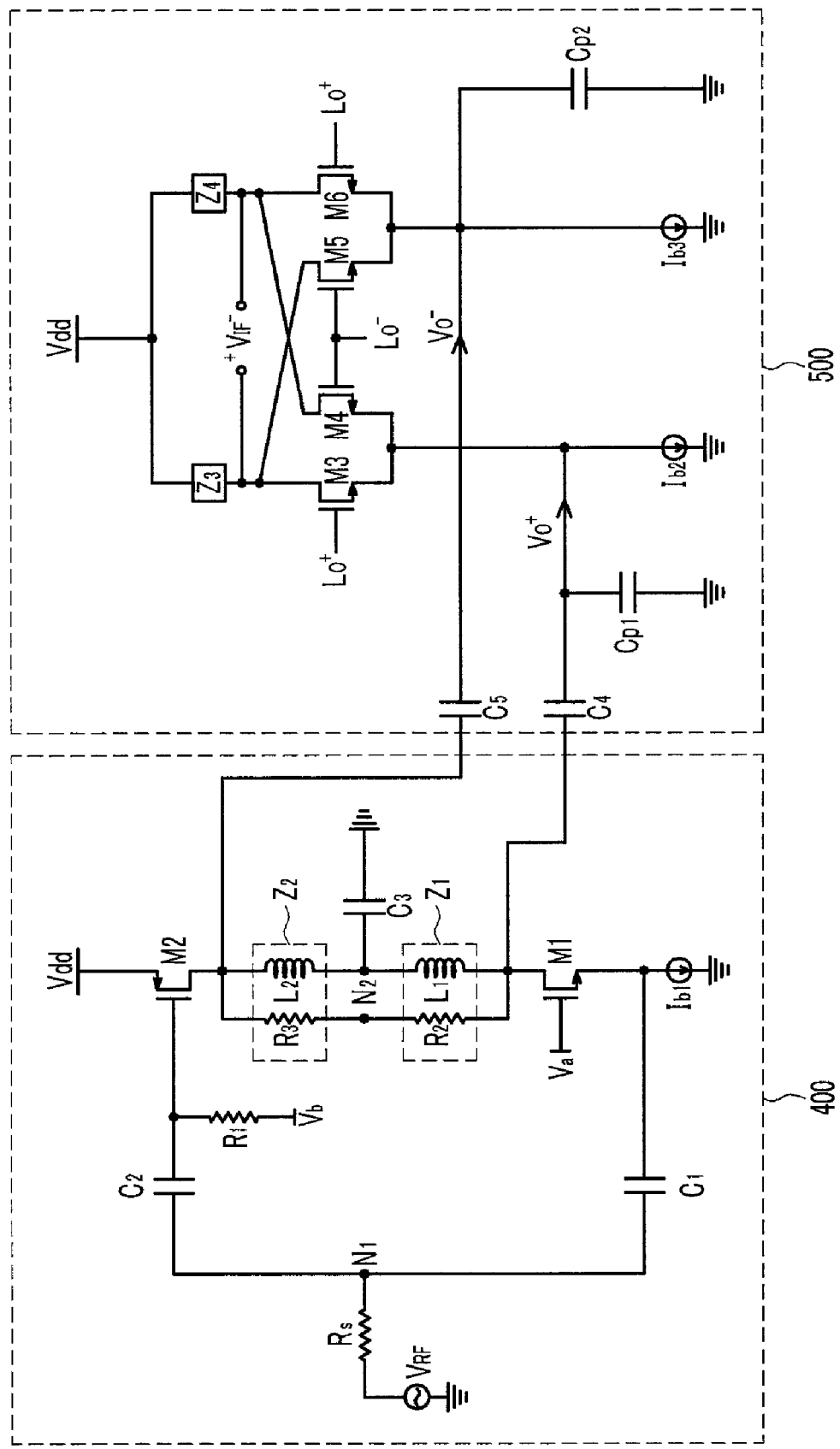
FIG. 4 shows a detailed circuit diagram of a differential signal converter and a frequency down-converter of a wireless communication system according to an exemplary embodiment of the present invention.

FIG. 4 shows a detailed circuit diagram of a differential signal converter and a frequency down-converter of a wireless communication system according to an exemplary embodiment of the present invention.

Referring to FIG. 4, the wireless communication system includes a differential signal converter 400 and a frequency down converter 500 coupled with each other.

The frequency down converter 500 includes third and fourth transistors M3 and M4 in pairs and fifth and sixth transistors M5 and M6 in pairs, and also includes a third load Z3 coupled between a drive voltage (Vdd) and the third and fifth transistors M3 and M5, and a fourth load Z4 coupled between the drive voltage (Vdd) and the fourth and sixth transistors M4 and M6.

The third to sixth transistors (M3-M6) are n-channel field effect transistors.

The third and sixth transistors M3 and M6 are controlled by a positive local oscillation signal (LO$^+$), and the fourth and fifth transistors M4 and M5 are controlled by a negative local oscillation signal (LO$^-$).

The source terminals of the third and fourth transistors M3 and M4 are coupled to a second bias current source Ib2, and a positive signal (Vo$^+$) from among the differential radio frequency signals is input thereto. In this instance, the output terminal of the common gate amplifier 410 is coupled to the source terminals of the third and fourth transistors M3 and M4 through the fourth capacitor C4. The source terminals of the fifth and sixth transistors M5 and M6 are coupled to a third bias current source Ib3, and a negative signal (Vo$^-$) from among the differential radio frequency signals is input thereto. In this instance, the output terminal of the common source amplifier 420 is coupled to the source terminals of the fifth and sixth transistors M5 and M6 through the fifth capacitor C5.

A third load Z3 is coupled between the drain terminals of the third and fifth transistors M3 and M5 and the drive voltage (Vdd), and the drain terminals of the third and fifth transistors M3 and M5 outputs a positive intermediate frequency signal ($V_{IF}^+$). A fourth load Z4 is coupled between the drain terminals of the fourth and sixth transistors M4 and M6 and the drive voltage (Vdd), and the drain terminals of the fourth and sixth transistors M4 and M6 output a negative intermediate frequency signal ($V_{IF}^-$).

The frequency down converter 500 adds the local oscillation signals ($LO^+$, $LO^-$) to the radio frequency signals ($Vo^+$, $Vo^-$) that are input signals to generate intermediate frequency signals ($V_{IF}^+$, $V_{IF}^-$) corresponding to the frequency difference between the two signals as output signals.

The first load Z1 of FIG. 2 and FIG. 3 includes a second resistor R2 and a first inductor L1 coupled in parallel as shown in FIG. 4, the second load Z2 of FIG. 2 and FIG. 3 includes a third resistor R3 and a second inductor L2 coupled in parallel as shown in FIG. 4. However the configuration of the first and second loads Z1 and Z2 is not restricted thereto, and it can include at least one element of a resistor, an inductor, and a capacitor, or a serial or parallel circuit of the at least two elements. The configuration of the differential signal converter 400 of FIG. 4 corresponds to that shown in FIG. 2 and FIG. 3, and no detailed description thereof will be provided.

The output terminals of the common gate amplifier 410 and the common source amplifier 420 can form a parasitic capacitor with another wiring and elements, and they are depicted as Cp1 and Cp2 in FIG. 4. The second resistor R2 and the first inductor L1 of the first load Z1 resonates in the operational frequency of the wireless communication system with the parasitic capacitor Cp1, and the third resistor R3 and the second inductor L2 of the second load Z2 resonates in the operational frequency of the wireless communication system with the parasitic capacitor Cp2. Then, parasitic capacitors Cp1 and Cp2 occurring at the source terminals of the third to sixth transistors M3 to M6 can be eliminated to thus improve the thermal noise characteristic generated by the frequency down converter 500.

Effects caused by embodiments of the present invention will now be described with reference to FIG. 5 and FIG. 6.

Figure 5:
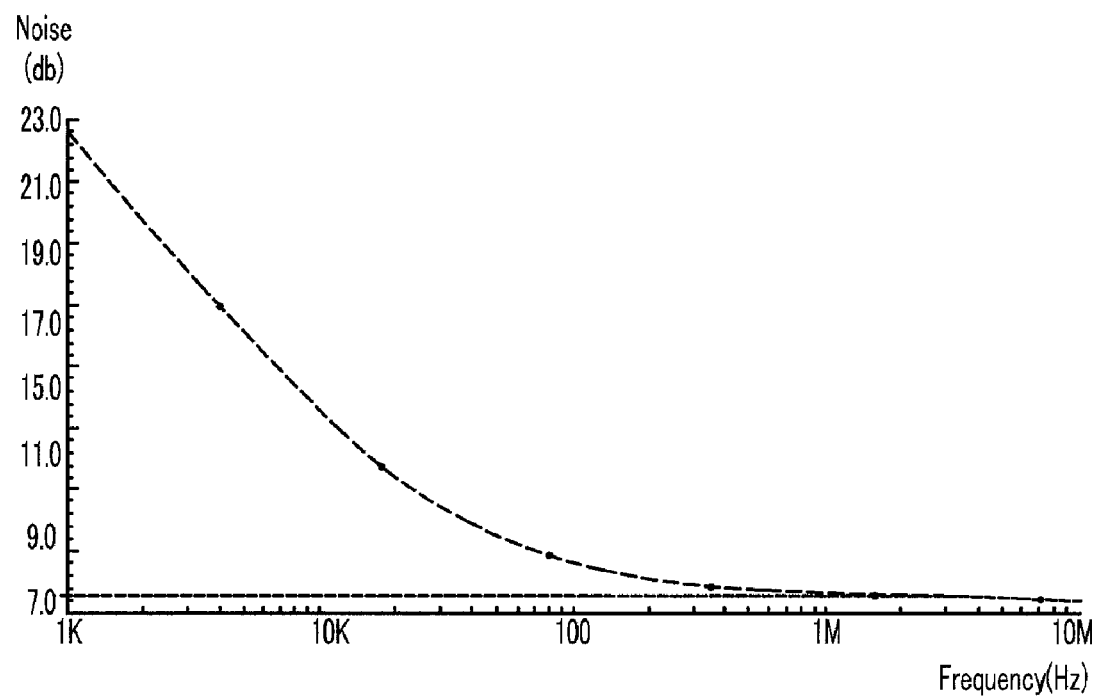
FIG. 5 and FIG. 6 respectively show a graph of measured single sideband noise figure and double sideband noise figure with the operational frequency of a radio frequency signal as 2 GHz regarding a circuit of FIG. 4.
Figure 6:
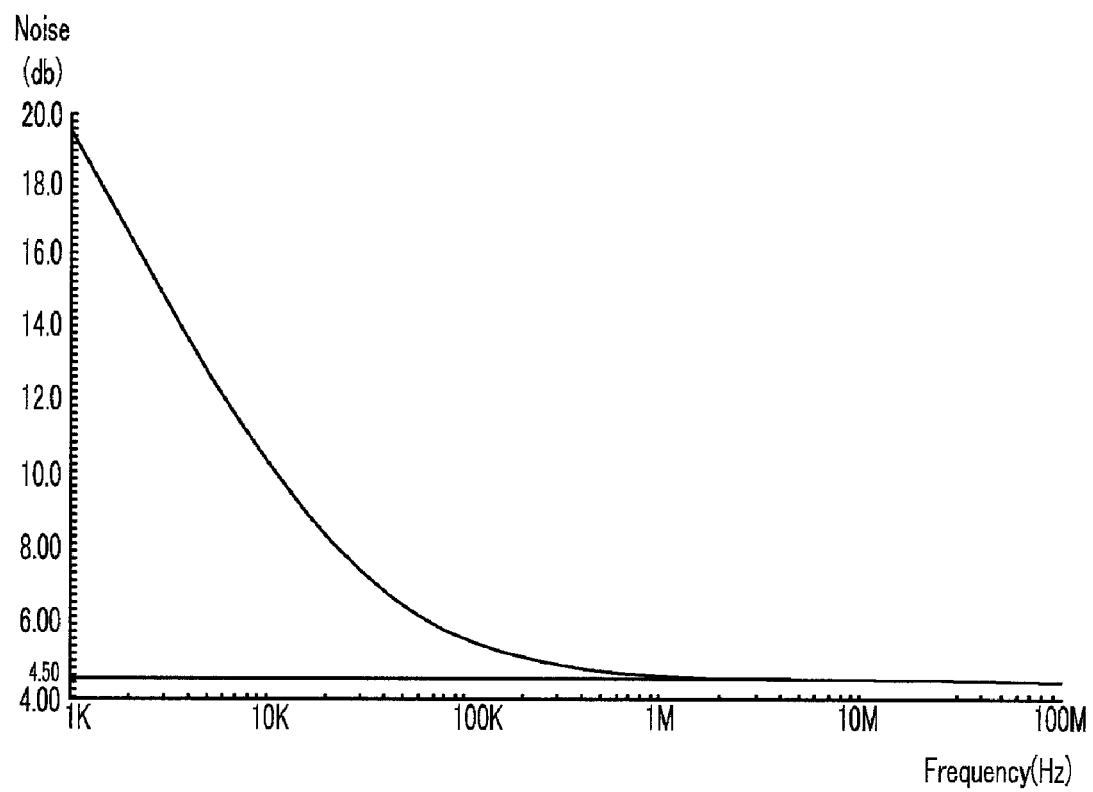

FIG. 5 and FIG. 6 respectively show a graph of measured single sideband noise figure and double sideband noise figure with the operational frequency of a radio frequency signal as 2 GHz regarding a circuit of FIG. 4.

When the down converted frequency is 1 MHz, the single sideband noise figure is 7 dB referring to FIG. 5, and the double sideband noise figure is 4.5 dB referring to FIG. 6. It is because the influence of the thermal noise current source ($i_n$) of the common gate amplifier 410 is removed in the exemplary embodiment of FIG. 4, and the parasitic capacitors Cp1 and Cp2 generated at the emitter terminals of the third to sixth transistors M3 to M6 are eliminated from the operational frequency of the radio frequency signal by the first and second inductors L1 and L2 respectively configuring the first and second loads Z1 and Z2.

The above-described embodiments can be realized through a program for realizing functions corresponding to the configuration of the embodiments or a recording medium for recording the program in addition to through the above-described device and/or method, which is easily realized by a person skilled in the art.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A receiving device of a wireless communication system comprising:
   a differential signal converter receiving a single ended radio frequency signal and converting the single ended radio frequency signal into a differential radio frequency signal; and
   a frequency down converter down converting the differential radio frequency signal to down frequency signal,
   wherein the differential signal converter comprises a common gate amplifier and a common source amplifier using a same bias current source, and the common gate amplifier and the common source amplifier are coupled in series between a drive voltage and the bias current source.

2. The receiving device of claim 1, wherein
   the differential signal converter further comprises an input terminal for receiving the single ended radio frequency signal, and
   the common gate amplifier and the common source amplifier receive the single ended radio frequency signal through the input terminal.

3. The receiving device of claim 2, wherein the common gate amplifier generates a positive signal of the differential radio frequency signal from the single ended radio frequency signal, and comprises a first output terminal for outputting the positive signal of the differential radio frequency signal, and
   the common source amplifier generates a negative signal of the differential radio frequency signal from the single ended radio frequency signal, and comprises a second, output terminal for outputting the negative signal of the differential radio frequency signal.

4. The receiving device of claim 3, wherein
   the common gate amplifier further comprises a first transistor and a first load coupled in series, a node thereof being coupled to the first output terminal, and
   the common source amplifier further comprises a second transistor and a second load coupled in series, a node thereof being coupled to the second output terminal.

5. The receiving device of claim 4, wherein
   the product of transconductance of the first transistor and the first load corresponds to the product of transconductance of the second transistor and the second load.

6. The receiving device of claim 4, wherein
   the first transistor is an n-channel field effect transistor, and the second transistor is a p-channel field effect transistor.

7. The receiving device of claim 4, wherein
   the first load corresponds to the product of:
     the second load;
     resistance formed between a receiving terminal for receiving the single ended radio frequency signal and the input terminal; and
     transconductance of the second transistor.

8. The receiving device of claim 4, wherein
   the first load comprises a first resistor and a first inductor coupled in parallel, and the second load comprises a second resistor and a second inductor coupled in parallel.

9. The receiving device of claim 4, wherein
   the frequency down converter comprises a third transistor, a fourth transistor, a fifth transistor, and a sixth transistor, and the first output terminal is coupled to source terminals of the third and fourth transistors, and the second output terminal is coupled to source terminals of the fifth and sixth transistors.

10. The receiving device of claim 4, wherein the first load and the second load meet on a node, and the node is AC grounded.

11. A differential signal converting device comprising:
a common gate amplifier receiving a single ended radio frequency signal and outputting a first radio frequency signal; and
a common source amplifier receiving the single ended radio frequency signal and outputting a second radio frequency signal, wherein
the common gate amplifier and the common source amplifier use a same bias current source, and the common gate amplifier and the common source amplifier are coupled in series between a drive voltage and the bias current source.

12. The differential signal converting device of claim 11, wherein
the common gate amplifier comprises
a first transistor comprising a gate terminal for receiving a first voltage, a source terminal for receiving the single ended radio frequency signal, and drain terminal for outputting the first radio frequency signal; and
a first load coupled to the drain terminal of the first transistor, and
the common source amplifier comprises
a second transistor comprising a gate terminal for receiving the single ended radio frequency signal, a source terminal for receiving a second voltage, and a drain terminal for outputting the second radio frequency signal; and
a second load coupled to the drain terminal of the second transistor.

13. The differential signal converting device of claim 12, wherein
the product of transconductance of the first transistor and the first load corresponds to the product of transconductance of the second transistor and the second load.

14. The differential signal converting device of claim 12, wherein
the first load corresponds to the product of:
the second load;
resistance formed between a receiving terminal for receiving the single ended radio frequency signal and the input terminal; and
transconductance of the second transistor.

15. The differential signal converting device of claim 12, wherein
the first load and the second load are AC grounded.

* * * * *